(12) United States Patent
Banerjee et al.

(10) Patent No.: US 10,775,466 B2
(45) Date of Patent: Sep. 15, 2020

(54) SYSTEM AND METHOD FOR MAGNETIC RESONANCE IMAGING AN OBJECT VIA A STOCHASTIC OPTIMIZATION OF A SAMPLING FUNCTION

(71) Applicants: GE Precision Healthcare LLC, Wauwatosa, WI (US); THE BOARD OF TRUSTEES OF THE LELAND STANFORD JUNIOR UNIVERSITY, Palo Alto, CA (US)

(72) Inventors: Suchandrima Banerjee, Berkeley, CA (US); Enhao Gong, Sunnyvale, CA (US); Greg Zaharchuk, Stanford, CA (US); John Pauly, Stanford, CA (US)

(73) Assignee: GE PRECISION HEALTHCARE LLC, Wauwatosa, WI (US)

( * ) Notice: Subject to any disclaimer, the term of this patent is extended or adjusted under 35 U.S.C. 154(b) by 214 days.

(21) Appl. No.: 15/892,960

(22) Filed: Feb. 9, 2018

(65) Prior Publication Data
US 2019/0250233 A1     Aug. 15, 2019

(51) Int. Cl.
*G01R 33/561* (2006.01)
*G01R 33/54* (2006.01)
*G01R 33/48* (2006.01)

(52) U.S. Cl.
CPC ...... *G01R 33/5611* (2013.01); *G01R 33/4818* (2013.01); *G01R 33/543* (2013.01)

(58) Field of Classification Search
CPC ............ G01R 33/5611; G01R 33/4818; G01R 33/543

USPC ......................................................... 324/309
See application file for complete search history.

(56) References Cited

U.S. PATENT DOCUMENTS

| | | | |
|---|---|---|---|
| 2016/0054418 A1* | 2/2016 | Doneva | G01R 33/4818 324/309 |
| 2016/0061917 A1* | 3/2016 | Chase | A61B 5/7207 324/309 |
| 2016/0199004 A1* | 7/2016 | Meyer | G06T 11/008 382/131 |
| 2017/0261584 A1* | 9/2017 | James | G01R 33/4835 |

OTHER PUBLICATIONS

Nikou, C., Heitz, F., Armspach, J.P., Namer, I.J. and Grucker, D., 1998. Registration of MR/MR and MR/SPECT brain images by fast stochastic optimization of robust voxel similarity measures. NeuroImage, 8(1), pp. 30-43. (Year: 1998).*

(Continued)

*Primary Examiner* — Christopher P McAndrew
(74) *Attorney, Agent, or Firm* — Armstrong Teasdale LLP (57) ABSTRACT

A system for magnetic resonance imaging an object via a stochastic optimization of a sampling function is provided. The system includes a magnet assembly and a controller. The magnet assembly is operative to acquire MR data from the object. The controller is operative to: acquire a first MR data set using the magnet assembly; select the sampling function from a plurality of sampling function candidates based at least in part on the stochastic optimization; and acquire a second MR data set from the object using the magnet assembly based at least in part on the sampling function.

20 Claims, 4 Drawing Sheets

(56) References Cited

OTHER PUBLICATIONS

Enhao Gong, Feng Huang, John Pauly; "A Clinically Applicable Scheme of MRI Trajectory Optimization for 3D Cartesian Acquisition"; Proc. Intl. Soc. Mag. Reson. Med. 22 (2014); p. 0610; Electrical Engineering, Stanford University, Stanford, CA, US; Philips Healthcare, Gainesville, FL, US.

Evan Levine; Brian Hargreaves; "Differential Domain Analysis for 3D Cartesian Sampling"; pp. 1-2; Electrical Engineering, Stanford University, Stanford, CA, US; Radiology, Stanford, CA, US.

M. Seeger, H. Nickisch, R. Pohmann, B. Scholkopf; "Optimization of K-Space Trajectories by Bayesian Experimental Design"; Proc. Intl. Mag. Reson. Med. 17 (2009); p. 2627; Saarland University, Saarbrucken, Germany, Max Planck Institute for Biological Cybernetics, Tubringen, Germany.

Duan-Duan Liu, Dong Liang, Xin Liu, Yuan-Ting Zhang; "Under-Sampling Trajectory Design for Compressed Sensing MRI"; 34th Annual International Conference of the IEEE EMBS, San Diego, CA, US, 2012; pp. 73-76.

Matthias Seeger, Hannes Nickisch, Rolf Pohmann, Bernhard Scholkopf; "Optimization of K-Space Trajectories for Compressed Sensing by Bayesian Experimental Design"; (2010) Magnetic Resonance in Medicine 63; pp. 116-126.

Enhao Gong; Declaration of Financial Interests or Relationships; May 10-16, 2014; Joint Annual Meeting ISMRM-ESMRMB.

* cited by examiner

SYSTEM AND METHOD FOR MAGNETIC RESONANCE IMAGING AN OBJECT VIA A STOCHASTIC OPTIMIZATION OF A SAMPLING FUNCTION

BACKGROUND

Technical Field

Embodiments of the invention relate generally to medical imaging systems, and more specifically, to a system and method for magnetic resonance imaging of an object via a stochastic optimization of a sampling function.

Discussion of Art

MRI is a widely accepted and commercially available technique for obtaining digitized visual images representing the internal structure of objects having substantial populations of atomic nuclei that are susceptible to nuclear magnetic resonance ("NMR"). Many MRI systems use superconductive magnets to scan a subject/patient via imposing a strong main magnetic field on the nuclei in the subject to be imaged. The nuclei are excited by a radio frequency ("RF") signal/pulse transmitted by a RF coil at characteristics NMR (Larmor) frequencies. By spatially disturbing localized magnetic fields surrounding the subject and analyzing the resulting RF responses, also referred to hereinafter as the "MR signal," from the nuclei as the excited protons relax back to their lower energy normal state, a map or image of these nuclei responses as a function of their spatial location is generated and displayed. An image of the nuclei responses, also referred to hereinafter as an "MRI image" and/or simply "image," provides a non-invasive view of a subject's internal structure.

Many traditional MRI systems have lengthy K-space sampling times, i.e., scan times, that often adversely reduce patient throughput, image quality, spatial and temporal resolution. Moreover, the longer a MRI system's scan time, the higher the risk of incurring motion artifacts in the generated images. Several approaches have been proposed to speed up MRI scan times by undersampling K-space and synthesizing data during image reconstructions, e.g., Parallel Imaging ("PI") and Compressed Sensing ("CS"), which often take advantage of both multi-channel sensitivity and image sparsity properties. While such approaches have resulted in improved/reduced scan times, selecting an optimal undersampling trajectory for differing scans given a particular undersampling ratio is often problematic. For example, many traditional approaches of selecting an undersampling trajectory are themselves slow and/or not optimal or generalizable for different datasets/scans.

What is needed, therefore, is an improved system and method for magnetic resonance imaging an object via a stochastic optimization of a sampling function.

BRIEF DESCRIPTION

In an embodiment, a system for magnetic resonance imaging an object via a stochastic optimization of a sampling function is provided. The system includes a magnet assembly and a controller. The magnet assembly is operative to acquire MR data from the object. The controller is operative to: acquire a first MR data set using the magnet assembly; select the sampling function from a plurality of sampling function candidates based at least in part on the stochastic optimization; and acquire a second MR data set from the object using the magnet assembly based at least in part on the sampling function.

In another embodiment, a method for magnetic resonance imaging an object via a stochastic optimization of a sampling function is provided. The method includes acquiring a first MR data set from the object using a magnet assembly; selecting the sampling function from a plurality of sampling function candidates based at least in part on the stochastic optimization via a controller; and acquiring a second MR data set from the object using the magnet assembly based at least in part on the sampling function.

In yet another embodiment, a non-transitory computer readable medium storing instructions is provided. The instructions are configured to adapt a controller to: acquire a first MR data set from an object using a magnet assembly of a magnetic resonance imaging system; select a sampling function from a plurality of sampling function candidates based at least in part on a stochastic optimization; and acquire a second MR data set from the object using the magnet assembly based at least in part on the sampling function.

DRAWINGS

The present invention will be better understood from reading the following description of non-limiting embodiments, with reference to the attached drawings, wherein below.

DETAILED DESCRIPTION

Reference will be made below in detail to exemplary embodiments of the invention, examples of which are illustrated in the accompanying drawings. Wherever possible, the same reference characters used throughout the drawings refer to the same or like parts, without duplicative description.

As used herein, the terms "substantially," "generally," and "about" indicate conditions within reasonably achievable manufacturing and assembly tolerances, relative to ideal desired conditions suitable for achieving the functional purpose of a component or assembly. As used herein, "electrically coupled," "electrically connected," and "electrical communication" mean that the referenced elements are directly or indirectly connected such that an electrical current may flow from one to the other. The connection may include a direct conductive connection, i.e., without an intervening capacitive, inductive or active element, an inductive connection, a capacitive connection, and/or any other suitable electrical connection. Intervening components may be present. The term "real-time," as used herein, means a level of processing responsiveness that a user senses as sufficiently immediate or that enables the processor to keep up with an external process. The term "MR data," as used herein, refers to data, e.g., raw K-Space and/or image space, derived from an MR signal. As used herein, the term "sampling function" refers to a function that determines the order/manner a MRI system acquires positions of K-space. Accordingly, the terms "sampling function candidate" and "candidate" refer to a possible sampling function that an MRI system may follow/use.

Further, it is to be understood that embodiments of the present invention may be applicable to traditional MRI, parallel imaging, UTE MRI, Silent MRI, PET/MRI, and/or any type of MRI based imaging system. Further still, as will be appreciated, embodiments of the present invention related imaging systems may be used to analyze tissue generally and are not limited to human tissue.

Figure 1:
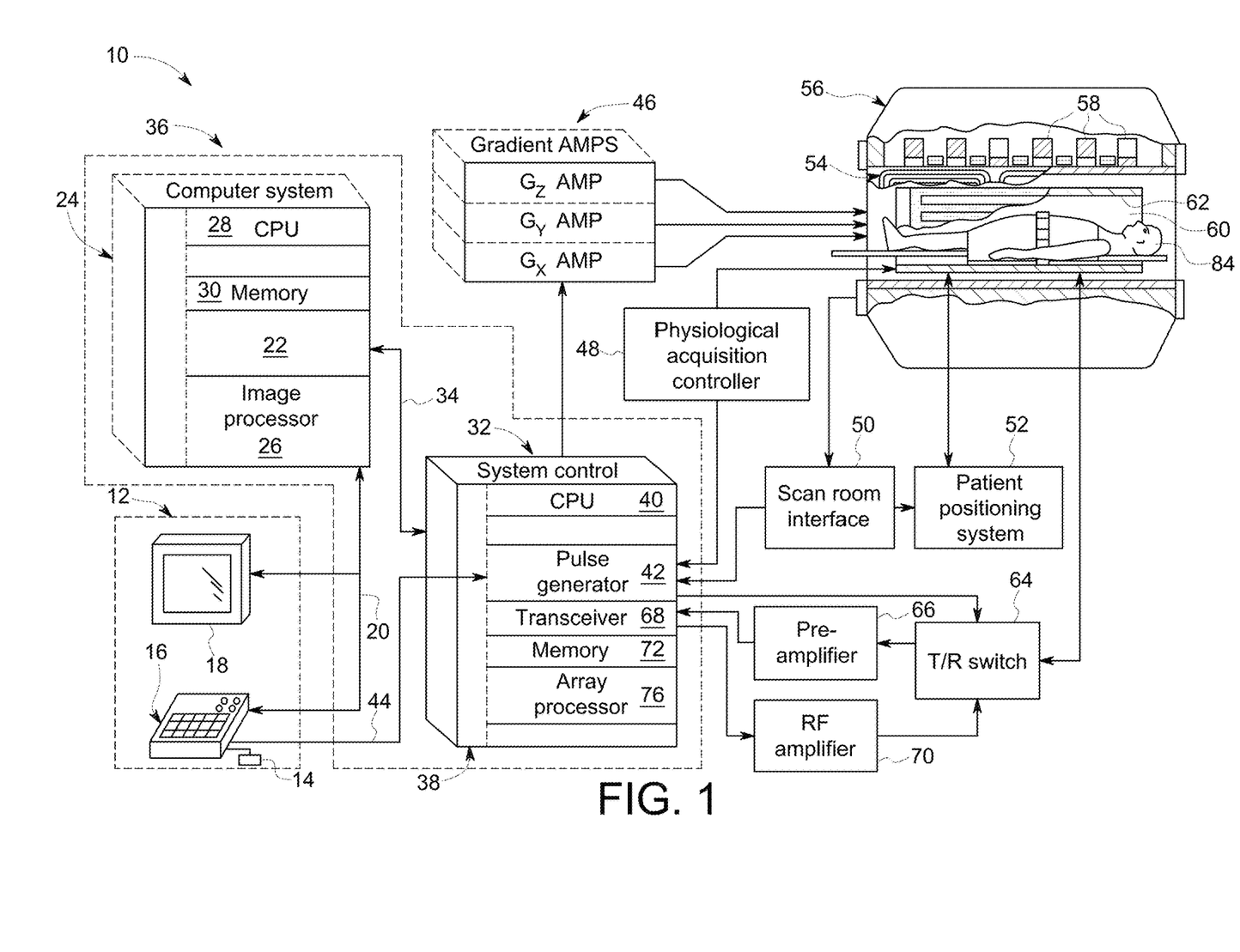
FIG. 1 is a block diagram of a system for magnetic resonance imaging an object via a stochastic optimization of a sampling function, in accordance with an embodiment of the present invention.

Referring now to FIG. 1, the major components of an MRI system 10 incorporating an embodiment of the invention are shown. As explained in greater detail below, embodiments of the present invention provide for an MRI system that has improved efficiency and performance, as compared to traditional MRI systems, by using stochastic optimization to determine/generate the optimal acquisition trajectory/sampling function from a plurality of candidates for a given scan and object. As also explained in greater detail below, embodiments of the present invention may use an estimation metric to quickly access the potential performance of one or more of the candidate functions for a given scan and object.

Accordingly, operation of the system 10 is controlled from the operator console 12, which includes a keyboard or other input device 14, a control panel 16, and a display screen 18. The console 12 communicates through a link 20 with a separate computer system 22 that enables an operator to control the production and display of images on the display screen 18. The computer system 22 includes a number of modules, which communicate with each other through a backplane 24. These include an image processor module 26, a CPU module 28 and a memory module 30, which may include a frame buffer for storing image data arrays. The computer system 22 communicates with a separate system control or control unit 32 through a high-speed serial link 34. The input device 14 can include a mouse, joystick, keyboard, track ball, touch activated screen, light wand, voice control, or any similar or equivalent input device, and may be used for interactive geometry prescription. The computer system 22 and the MRI system control 32 collectively form an "MRI controller" 36.

The MRI system control 32 includes a set of modules connected together by a backplane 38. These include a CPU module 40 and a pulse generator module 42, which connects to the operator console 12 through a serial link 44. It is through link 44 that the system control 32 receives commands from the operator to indicate the scan sequence that is to be performed. The pulse generator module 42 operates the system components to execute the desired scan sequence and produces data which indicates the timing, strength and shape of the RF pulses produced, and the timing and length of the data acquisition window. The pulse generator module 42 connects to a set of gradient amplifiers 46, to indicate the timing and shape of the gradient pulses that are produced during the scan. The pulse generator module 42 can also receive patient data from a physiological acquisition controller 48 that receives signals from a number of different sensors connected to the patient, such as ECG signals from electrodes attached to the patient. And finally, the pulse generator module 42 connects to a scan room interface circuit 50, which receives signals from various sensors associated with the condition of the patient and the magnet system. It is also through the scan room interface circuit 50 that a patient positioning system 52 receives commands to move the patient to the desired position for the scan.

The pulse generator module 42 operates the gradient amplifiers 46 to achieve desired timing and shape of the gradient pulses that are produced during the scan. The gradient waveforms produced by the pulse generator module 42 are applied to the gradient amplifier system 46 having Gx, Gy, and Gz amplifiers. Each gradient amplifier excites a corresponding physical gradient coil in a gradient coil assembly, generally designated 54, to produce the magnetic field gradients used for spatially encoding acquired signals. The gradient coil assembly 54 forms part of a magnet assembly 56, which also includes a polarizing magnet 58 (which in operation, provides a homogenous longitudinal magnetic field $B_0$ throughout a target volume 60 that is enclosed by the magnet assembly 56) and a whole-body (transmit and receive) RF coil 62 (which, in operation, provides a transverse magnetic field $B_1$ that is generally perpendicular to $B_0$ throughout the target volume 60).

The resulting signals emitted by the excited nuclei in the patient may be sensed by the same RF coil 62 and coupled through the transmit/receive switch 64 to a preamplifier 66. The amplifier MR signals are demodulated, filtered, and digitized in the receiver section of a transceiver 68. The transmit/receive switch 64 is controlled by a signal from the pulse generator module 42 to electrically connect an RF amplifier 70 to the RF coil 62 during the transmit mode and to connect the preamplifier 66 to the RF coil 62 during the receive mode. The transmit/receive switch 64 can also enable a separate RF coil (for example, a surface coil) to be used in either transmit or receive mode.

Figure 3:
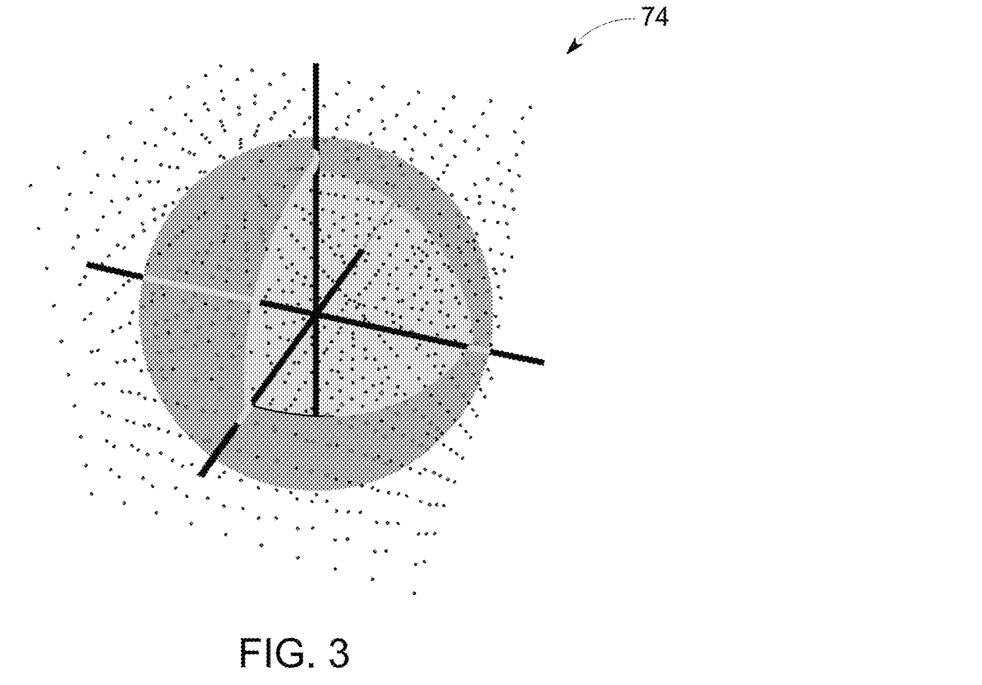
FIG. 3 is a diagram of a K-space acquired by the system of FIG. 1, in accordance with an embodiment of the present invention.

The MR signals picked up by the RF coil 62 are digitized by the transceiver module 68 and transferred to a memory module 72 in the system control 32. A scan is complete when an array of raw K-Space data 74 (FIG. 3) has been acquired in the memory module 72. This raw K-Space data/datum is rearranged into separate K-Space data arrays for each image to be reconstructed, and each of these is input to an array processor 76 which operates to Fourier transform the data into an array of image data. This image data is conveyed through the serial link 34 to the computer system 22 where it is stored in memory 30. In response to commands received from the operator console 12, this image data may be archived in long-term storage or it may be further processed by the image processor 26, conveyed to the operator console 12, and presented on the display 18.

Figure 2:
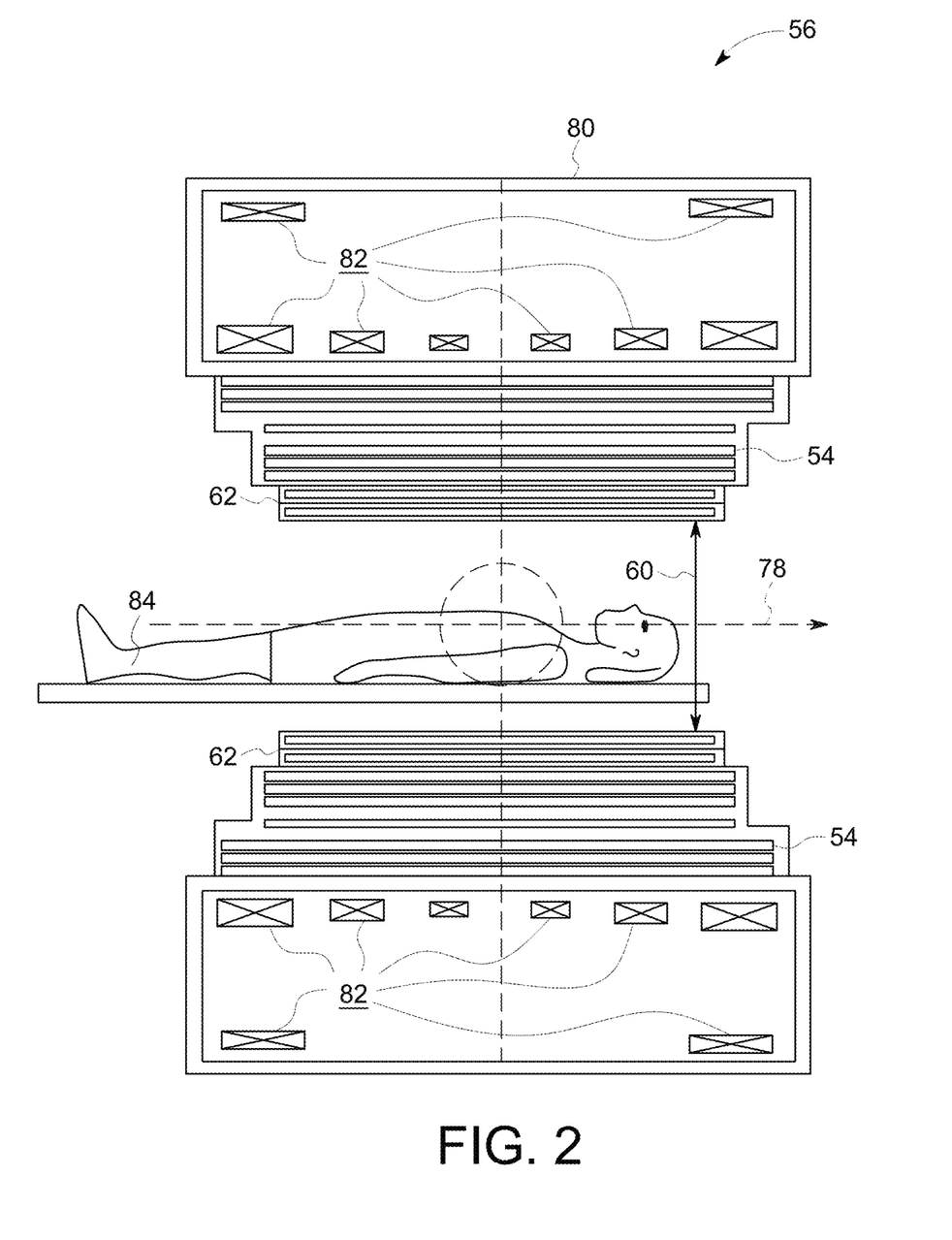
FIG. 2 is a schematic cross-sectional diagram of a magnet assembly of the system of FIG. 1, in accordance with an embodiment of the present invention.

As illustrated in FIG. 2, a schematic side elevation view of the magnet assembly 56 is shown in accordance with an embodiment of the invention. The magnet assembly 56 is cylindrical in shape having a center axis 78. The magnet assembly 56 includes a cryostat 80 and one or more radially aligned longitudinally spaced apart superconductive coils 82 that form the polarizing magnet 58 (FIG. 1). The superconductive coils 82 are capable of carrying large electrical currents and are designed to create the $B_0$ field within the patient/target volume 60. As will be appreciated, the magnet assembly 56 may further include both a terminal shield and a vacuum vessel (not shown) surrounding the cryostat 80 in order to help insulate the cryostat 80 from heat generated by the rest of the MRI system 10 (FIG. 1). The magnet assembly 56 may still further include other elements such as covers, supports, suspension members, end caps, brackets, etc. (not shown). While the embodiment of the magnet assembly 56 shown in FIGS. 1 and 2 utilizes a cylindrical topology, it should be understood that topologies other than cylindrical may be used. For example, a flat geometry in a split-open MRI system may also utilize embodiments of the invention described below. As further shown in FIG. 2, a patient/imaged subject 84 is inserted into the magnet assembly 56.

Figure 4:
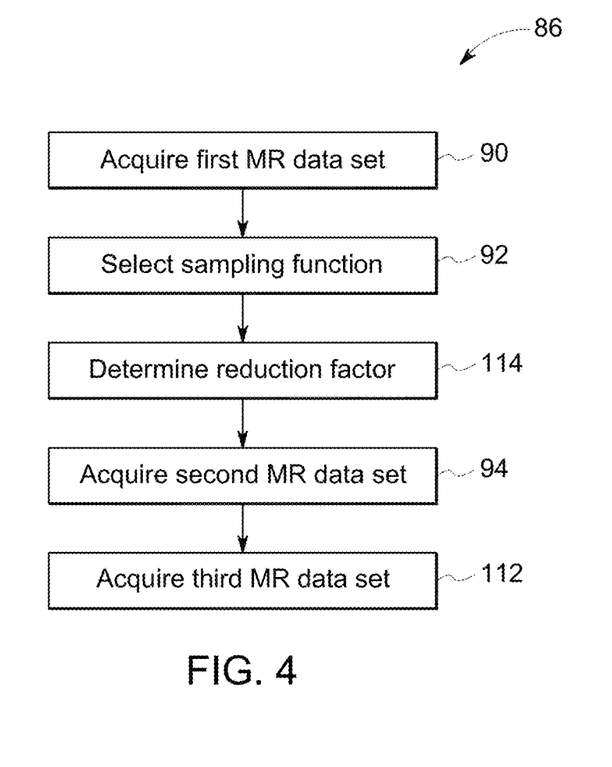
FIG. 4 is a flowchart of a method for magnetic resonance imaging an object via a stochastic optimization of a sampling function utilizing the system of FIG. 1, in accordance with an embodiment of the present invention.

Turning to FIG. 4, a flow chart depicting a method 86 for magnetic resonance imaging an object 84 (FIG. 1) via a stochastic optimization 88 (FIG. 5) of a sampling function utilizing the system 10 (FIG. 1) is shown. The method includes acquiring 90 a first MR data set from the object 84 via the magnet assembly 56, selecting 92 the sampling function from a plurality of sampling function candidates based at least in part on the stochastic optimization, and acquiring 94 a second MR data set from the object 84 via the magnet assembly 56 based at least in part on the sampling function.

Figure 5:
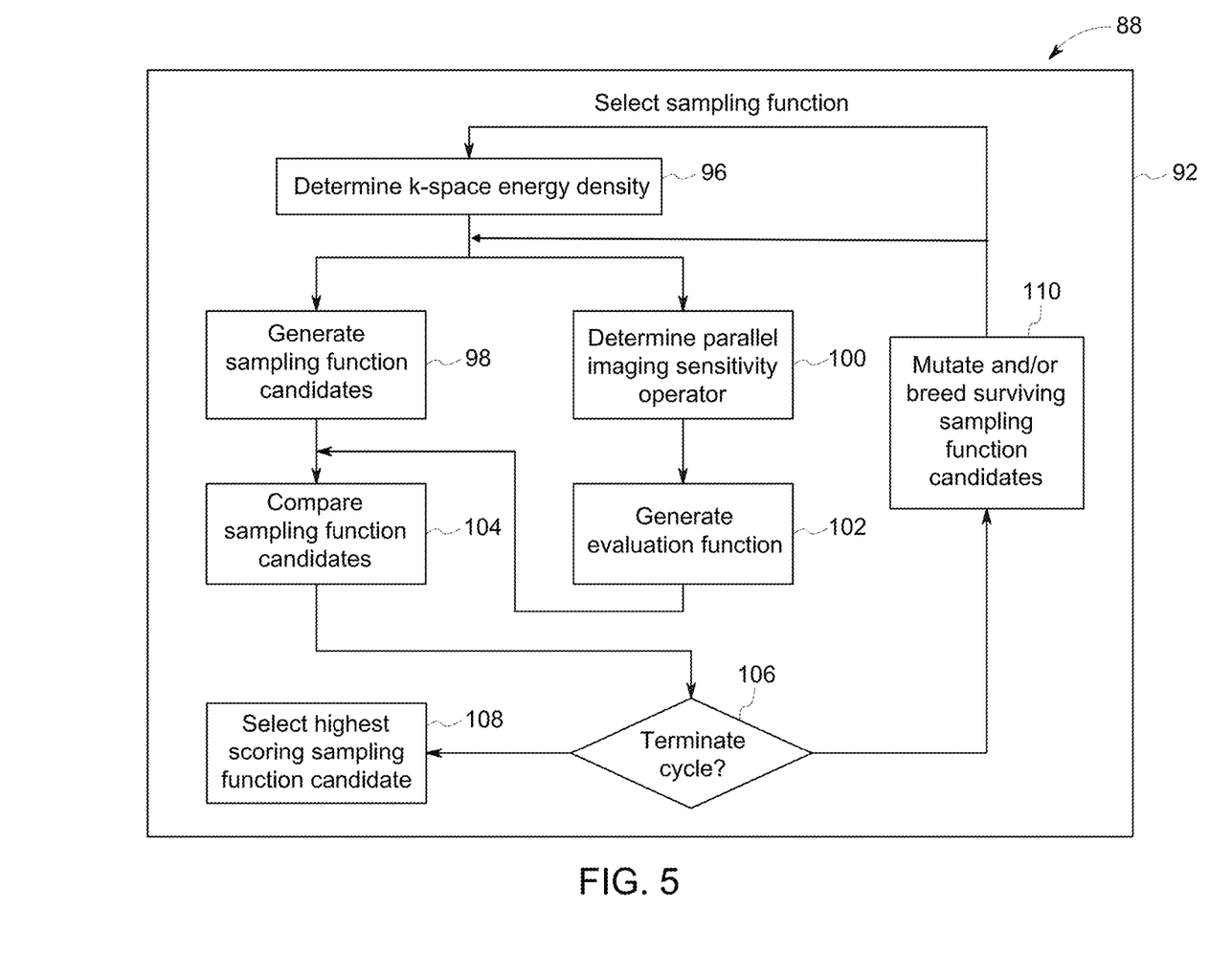
FIG. 5 is a flow chart depicting the stochastic optimization of the sampling function, in accordance with an embodiment of the present invention.

As illustrated in FIG. 5, in embodiments, the stochastic optimization 88 may include determining 96 a K-space energy density distribution and generating 98 the plurality of sampling function candidates. As will be understood, the K-space density distribution may be based at least in part on the first MR data set, with the sampling function candidates, in turn, based at least in part on the K-space density distribution. The first MR data set may also be used to determine to determine 100 a parallel imaging sensitivity operator, e.g., a kernel, which in turn, may be used to generate 102 an evaluation function, which further in turn, may be used to compare 104 two or more of the sampling function candidates to each other, with the highest scoring candidate being selected 108 as the sampling function for use in the acquisition 94 of the second MR data set. As used herein, the highest scoring candidate refers to the candidate having the best performance as determined by the evaluation function.

As will be appreciated, the first MR data set may be obtained during an initial calibration scan, to include sensitivity calibration, of the MRI system 10. The sampling function candidates may be auto-calibrating Cartesian reconstructions for a given reduction factor, which as will be appreciated, may be derived/generated from the determined 96 energy density distribution of the K-space corresponding to the first MR data set.

The evaluation function may be derived/generated 102 by combining the parallel imaging based sensitivity operator and a PSF Incoherence metric. In Compressed Sensing, reconstruction typically requires the undersampling to be incoherent (noise like) in the sparsifying transform. The incoherence property determines the final reconstruction accuracy and it can be quantified by the incoherence metric such as off-diagonal entries in point spread function ("PSF") or transform point spread function (TPSF"). For parallel imaging, the adjacent k-space measurement can often be interpolated using algorithms either in image domain or k-space by considering MRI coil sensitivity relationship between multiple coils. As will be appreciated, a combination effect of both k-space interpolation and the PSF/TPSF based incoherence metric may be used. Previously, estimated k-space information was used to estimate a parallel-imaging-recovered PSF and compute the incoherence metric from the modified PSF. The proposed solution is targeted to achieve accurate approximation of the resulting reconstruction error. In embodiments, the evaluation function may be optimized using pre-acquired datasets across several subjects/objects 84, and/or across several imaging contrasts, with similar anatomical information and coil 62, to include any body coils, setup.

As shown by the circular connections/path between boxes 96, 98, 100, 102, 104, 106, and 110, in embodiments, the stochastic optimization 88 may be performed in an iterative manner/framework initialized via an initially determined 96 K-space energy density distribution, such that the sampling function candidates are optimized by being assessed via the evaluation function over two or more cycles. For example, in embodiments, a first grouping of M sampling function candidates, e.g., M=ten (10) candidates, may be compared/scored 104 by the evaluation function in a first round of assessment, with only the highest scoring M/2, e.g. five (5), candidates moving on to a second round of assessment. Accordingly, as will be appreciated, in embodiments, the stochastic optimization may be based at least in part on simulated annealing or genetic evolution.

For example, in the above scenario having an initial $M_1$ value of ten (10) candidates, the surviving M/2 candidates may be mutated and/or bred 110 to produce another set of $M_2$ of ten (10) candidates, which may be assessed by the evaluation function with the top scoring candidate being selected as the sampling function, or with only the top $M_2/2$ candidates being mutated and/or bred again to complete another cycle. As will be appreciated, any number of cycles/generations of sampling function candidates may be performed, and the breading/mutation 110 may be performed with randomized parameters. Accordingly, embodiments of the stochastic optimization process 88 may employ sorting (competition) 104, combination (breeding/hybridization) and/or alternation (mutation) 110.

Thus, as will be appreciated, computation of sensitivity information from an initially acquired K-space/MR data set may be used to generate/build an operator/kernel, which in turn, extrapolates from each set of continuous k (k=5) K-space points on a phase-encoded ("PE") line to K-space points close to the PE line. Therefore, the entire PE K-space may be extrapolated using a neighborhood PE line. Accordingly, an entire K-space may be extrapolated by a pre-computation step with the resulting extrapolated K-space being used repeatedly to compute each performance metric value in the optimization.

As will be appreciated, in embodiments, the stochastic optimization optimizes the trajectory/sampling function in the outer layer. For example, there may be n generations/iterations in which a loss function decreases. Within each such generation/iteration, multiple candidate undersampling trajectories are evaluated, and then altered and combined to generate potentially better candidates for the next generation/iteration. Thus, the term "outer layer", as used herein, means the stochastic optimization runs in multiple generations/iterations. For example, there may be n generations/iterations of the stochastic optimization process 88 in which a loss function decreases for each iteration with the score of the sampling function candidates increasing for each iteration. In some embodiments, a local minimum in the stochastic optimization process 88 may be prevented by using a noisy comparison term, e.g., simulated annealing.

To compute the performance of each sampling function candidate within the comparison/sorting 104, embodiments may perform a pseudo-reconstruction step, as opposed to a full reconstruction. For example, a sampling function candidate may be interpolated by filling in the pre-computed ARC-like operator K-space, which in turn, may be used to computer the Coherence/Incoherence metric which is a measure/grade of the coherence of the sampling. As will be appreciated, the Coherence/Incoherence metric is fast to compute and incorporates both PI and CS information. In embodiments, another regression may be used to compute a single metric value from different norm values from the error distribution in both K-space and image domain, e.g., a machine learning algorithm which predicts the resulting reconstruction error/accuracy from candidate undersampling trajectories and/or from one or more Coherence/Incoherence metrics.

Referring back to FIG. 4, in embodiments, the method 86 may further include acquiring 112 a third MR data set based at least in part on the selected sampling function, and/or determining 114 a reduction factor based at least in part on the evaluation function.

Finally, it is also to be understood that the system 10 may include the necessary electronics, software, memory, storage, databases, firmware, logic/state machines, microprocessors, communication links, displays or other visual or audio user interfaces, printing devices, and any other input/output interfaces to perform the functions described herein and/or to achieve the results described herein. For example, as previously mentioned, the system may include at least one processor and system memory/data storage structures, which may include random access memory (RAM) and read-only memory (ROM). The at least one processor of the system 10 may include one or more conventional microprocessors and one or more supplementary co-processors such as math co-processors or the like. The data storage structures discussed herein may include an appropriate combination of magnetic, optical and/or semiconductor memory, and may include, for example, RAM, ROM, flash drive, an optical disc such as a compact disc and/or a hard disk or drive.

Additionally, a software application that adapts the controller to perform the methods disclosed herein may be read into a main memory of the at least one processor from a computer readable medium. The term "computer readable medium", as used herein, refers to any medium that provides or participates in providing instructions to the at least one processor of the system 10 (or any other processor of a device described herein) for execution. Such a medium may take many forms, including but not limited to, non-volatile media and volatile media. Non-volatile media include, for example, optical, magnetic, or opto-magnetic disks, such as memory. Volatile media include dynamic random access memory (DRAM), which typically constitutes the main memory. Common forms of computer readable media include, for example, a floppy disk, a flexible disk, hard disk, magnetic tape, any other magnetic medium, a CD-ROM, DVD, any other optical medium, a RAM, a PROM, an EPROM or EEPROM (electronically erasable programmable read-only memory), a FLASH-EEPROM, any other memory chip or cartridge, or any other medium from which a computer can read.

While in embodiments, the execution of sequences of instructions in the software application causes at least one processor to perform the methods/processes described herein, hard-wired circuitry may be used in place of, or in combination with, software instructions for implementation of the methods/processes of the present invention. Therefore, embodiments of the present invention are not limited to any specific combination of hardware and/or software.

It is further to be understood that the above description is intended to be illustrative, and not restrictive. For example, the above-described embodiments (and/or aspects thereof) may be used in combination with each other. Additionally, many modifications may be made to adapt a particular situation or material to the teachings of the invention without departing from its scope.

For example, in an embodiment, a system for magnetic resonance imaging an object via a stochastic optimization of a sampling function is provided. The system includes a magnet assembly and a controller. The magnet assembly is operative to acquire MR data from the object. The controller is operative to: acquire a first MR data set using the magnet assembly; select the sampling function from a plurality of sampling function candidates based at least in part on the stochastic optimization; and acquire a second MR data set from the object using the magnet assembly based at least in part on the sampling function. In certain embodiments, the stochastic optimization includes: determining a K-space energy density distribution based at least in part on the first MR data set; and generating the plurality of sampling function candidates based at least in part on the K-space energy density distribution. In certain embodiments, the stochastic optimization further includes: determining a parallel imaging sensitivity operator based at least in part on the first MR data set; generating an evaluation function based at least in part on the parallel imaging sensitivity operator; and comparing two or more of the sampling function candidates of the plurality to each other based at least in part on the evaluation function. In certain embodiments, generation of the evaluation function is further based at least in part a PSF Incoherence metric. In certain embodiments, the controller is further operative to determine a reduction factor based at least in part on the evaluation function. In certain embodiments, the controller is further operative to acquire a third MR data set from a different object using the magnet assembly based at least in part on the sampling function. In certain embodiments, the stochastic optimization is based at least in part on one of simulated annealing and genetic evolution.

Yet other embodiments provide for a method for magnetic resonance imaging an object via a stochastic optimization of a sampling function. The method includes acquiring a first MR data set from the object using a magnet assembly; selecting the sampling function from a plurality of sampling function candidates based at least in part on the stochastic optimization via a controller; and acquiring a second MR data set from the object using the magnet assembly based at least in part on the sampling function. In certain embodiments, the stochastic optimization includes: determining a K-space energy density distribution based at least in part on the first MR data set; and generating the plurality of sampling function candidates based at least in part on the K-space energy density distribution. In certain embodiments, the stochastic optimization further includes: determining a parallel imaging sensitivity operator based at least in part on the first MR data set; generating an evaluation function based at least in part on the parallel imaging sensitivity operator; and comparing two or more of the sampling function candidates of the plurality to each other based at least in part on the evaluation function. In certain embodiments, the selected sampling function is the sampling function candidate with the best performance as determined by the evaluation function. In certain embodiments, generation of the evaluation function is further based at least in part on a PSF Incoherence metric. In certain embodiments, the method further includes determining a reduction factor based at least in part on the evaluation function via the controller. In certain embodiments, the stochastic optimization is based at least in part on one of simulated annealing and genetic evolution. In certain embodiments, the method further includes acquiring a third MR data set from a different object using the magnet assembly based at least in part on the sampling function.

Yet still other embodiments provide for a non-transitory computer readable medium storing instructions. The instructions are configured to adapt a controller to: acquire a first MR data set from an object using a magnet assembly of a magnetic resonance imaging system; select a sampling function from a plurality of sampling function candidates based at least in part on a stochastic optimization; and acquire a second MR data set from the object using the magnet assembly based at least in part on the sampling function. In certain embodiments, the stochastic optimization includes: determining a K-space energy distribution based at least in part on the first MR data set; and generating the plurality of sampling function candidates based at least in part on the K-space energy density distribution. In certain embodiments, the stochastic optimization includes: determining a parallel imaging sensitivity operator based at least in part on the first MR data set; generating an evaluation function based at least in part on the parallel imaging sensitivity operator; and comparing two or more of the sampling function candidates of the plurality to each other based at least in part on the evaluation function. In certain embodiments, generating an evaluation function is further based at least in part on a PSF Incoherence metric. In certain embodiments, the stochastic optimization is based at least in part on one of simulated annealing and genetic evolution.

Accordingly, by using stochastic optimization to select the optimal sampling function/trajectory for a given subject and scan type, some embodiments of the present invention may provide for scan times more than one-hundred times (100x) faster than traditional global trajectory optimization methods, e.g., Bayesian based methods, and/or greedy solutions. For example, some embodiments of the present invention may generate an undersampling design/selected sampling function within about ten (10) seconds.

Additionally, while the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "bottom," "top," etc. are used merely as labels, and are not intended to impose numerical or positional requirements on their objects. Further, the limitations of the following claims are not written in means-plus-function format are not intended to be interpreted as such, unless and until such claim limitations expressly use the phrase "means for" followed by a statement of function void of further structure.

This written description uses examples to disclose several embodiments of the invention, including the best mode, and also to enable one of ordinary skill in the art to practice the embodiments of invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described invention, without departing from the spirit and scope of the invention herein involved, it is intended that all of the subject matter of the above description shown in the accompanying drawings shall be interpreted merely as examples illustrating the inventive concept herein and shall not be construed as limiting the invention.

What is claimed is:

1. A system for magnetic resonance imaging an object via a stochastic optimization of a K-space sampling function comprising:
   a magnet assembly operative to acquire MR data from the object; and
   a controller operative to:
      acquire a first MR data set using the magnet assembly;
      select the K-space sampling function from a plurality of sampling function candidates using the stochastic optimization, wherein the K-space sampling function includes an acquisition trajectory along which the magnet assembly scans through K-space; and
      acquire a second MR data set from the object using the magnet assembly by acquiring positions in the K-space according to the acquisition trajectory.

2. The system of claim 1, wherein the stochastic optimization includes:
   determining a K-space energy density distribution based at least in part on the first MR data set; and
   generating the plurality of sampling function candidates based at least in part on the K-space energy density distribution.

3. The system of claim 1, wherein the stochastic optimization further includes:
   determining a parallel imaging sensitivity operator based at least in part on the first MR data set;
   generating an evaluation function based at least in part on the parallel imaging sensitivity operator; and
   comparing two or more of the sampling function candidates of the plurality to each other based at least in part on the evaluation function.

4. The system of claim 3, wherein generation of the evaluation function is further based at least in part on a PSF Incoherence metric.

5. The system of claim 3, wherein the controller is further operative to:
   determine a reduction factor based at least in part on the evaluation function.

6. The system of claim 1, wherein the controller is further operative to:
   acquire a third MR data set from a different object using the magnet assembly based at least in part on the K-space sampling function.

7. The system of claim 1, wherein the stochastic optimization is based at least in part on one of simulated annealing and genetic evolution.

8. A method for magnetic resonance imaging an object via a stochastic optimization of a K-space sampling function comprising:
   acquiring a first MR data set from the object using a magnet assembly;
   selecting the K-space sampling function from a plurality of sampling function candidates using the stochastic optimization via a controller, wherein the K-space sampling function includes an acquisition trajectory along which the magnet assembly scans through K-space; and
   acquiring a second MR data set from the object using the magnet assembly by acquiring positions in the K-space according to the acquisition trajectory.

9. The method of claim 8, wherein the stochastic optimization includes:
   determining a K-space energy density distribution based at least in part on the first MR data set; and
   generating the plurality of sampling function candidates based at least in part on the K-space energy density distribution.

10. The method of claim 8, wherein the stochastic optimization further includes:
    determining a parallel imaging sensitivity operator based at least in part on the first MR data set;
    generating an evaluation function based at least in part on the parallel imaging sensitivity operator; and
    comparing two or more of the sampling function candidates of the plurality to each other based at least in part on the evaluation function.

11. The method of claim 10, wherein the selected K-space sampling function is the sampling function candidate with the best performance as determined by the evaluation function.

12. The method of claim 10, wherein generation of the evaluation function is further based at least in part on a PSF Incoherence metric.

13. The method of claim 10 further comprising:
    determining a reduction factor based at least in part on the evaluation function via the controller.

14. The method of claim 8, wherein the stochastic optimization is based at least in part on one of simulated annealing and genetic evolution.

15. The method of claim 8 further comprising:
    acquiring a third MR data set from a different object using the magnet assembly based at least in part on the K-space sampling function.

16. A non-transitory computer readable medium storing instructions configured to adapt a controller to:
    acquire a first MR data set from an object using a magnet assembly of a magnetic resonance imaging system;
    select a K-space sampling function from a plurality of sampling function candidates using a stochastic optimization, wherein the K-space sampling function includes an acquisition trajectory along which the magnet assembly scans through K-space; and
    acquire a second MR data set from the object using the magnet assembly by acquiring positions in the K-space according to the acquisition trajectory.

17. The non-transitory computer readable medium of claim 16, wherein the stochastic optimization includes:
    determining a K-space energy density distribution based at least in part on the first MR data set; and
    generating the plurality of sampling function candidates based at least in part on the K-space energy density distribution.

18. The non-transitory computer readable medium of claim 16, wherein the stochastic optimization includes:
    determining a parallel imaging sensitivity operator based at least in part on the first MR data set;
    generating an evaluation function based at least in part on the parallel imaging sensitivity operator; and
    comparing two or more of the sampling function candidates of the plurality to each other based at least in part on the evaluation function.

19. The non-transitory computer readable medium of claim 18, wherein generating an evaluation function is further based at least in part on a PSF Incoherence metric.

20. The non-transitory computer readable medium of claim 16, wherein the stochastic optimization is based at least in part on one of simulated annealing and genetic evolution.

* * * * *